US006611430B1

(12) United States Patent
Richard et al.

(10) Patent No.: US 6,611,430 B1
(45) Date of Patent: Aug. 26, 2003

(54) MINIATURE SELF-LOCKING, SPRING ACTION, MICROWAVE MODULE RETAINER

(75) Inventors: Patrick K. Richard, Baltimore, MD (US); Brian T. Drude, Arbutus, MD (US); Hurley K. Blackwell, Baltimore, MD (US); Lucinda G. Martin, Millersville, MD (US); H. Halley Lisle, Monrovia, MD (US); David A. Herlihy, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/233,461

(22) Filed: Sep. 4, 2002

(51) Int. Cl.[7] .................................................. H05K 7/20

(52) U.S. Cl. ....................... 361/704; 361/707; 257/718; 257/719; 257/727; 165/80.3; 174/16.3; 24/458

(58) Field of Search ................................ 361/704, 707, 361/709, 710, 717–721; 257/718, 727; 174/16.1, 16.3; 165/80.3; 24/458

(56) References Cited

U.S. PATENT DOCUMENTS

| | | | | | |
|---|---|---|---|---|---|
| 5,225,965 | A | * | 7/1993 | Bailey et al. | 361/704 |
| 5,274,193 | A | * | 12/1993 | Bailey et al. | 174/16.3 |
| 5,309,979 | A | * | 5/1994 | Brauer | 165/80.2 |
| 5,327,324 | A | * | 7/1994 | Roth | 361/707 |
| 6,005,531 | A | | 12/1999 | Cassen et al. | |
| 6,079,486 | A | * | 6/2000 | Cennamo et al. | 165/80.3 |
| 6,114,986 | A | | 9/2000 | Cassen et al. | |

* cited by examiner

*Primary Examiner*—Boris Chervinsky
(74) *Attorney, Agent, or Firm*—Birch, Stewart, Kolasch & Birch, LLP

(57) ABSTRACT

A miniature, self-locking, spring action, microwave T/R module retainer device includes a retainer body that holds a double arched spring and transfers the spring load to a coldplate. The double arched spring configuration is designed to contact an extended heat sink plate located on one side of the microwave T/R module. When in position, the deflection of the double arched spring of the retainer device imparts a force onto the extended heat sink, pressing the T/R module against the coldplate when the module retainer device is installed. If the position of the T/R module changes due to thermal or mechanical loads, the potential energy stored in the arched spring allows the spring to automatically re-adjust accordingly.

13 Claims, 7 Drawing Sheets

FIG. 6
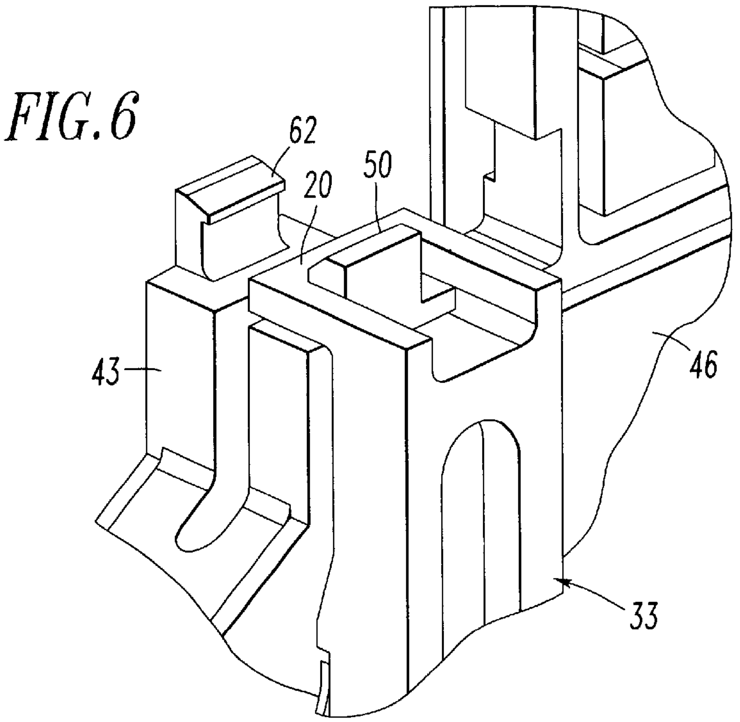
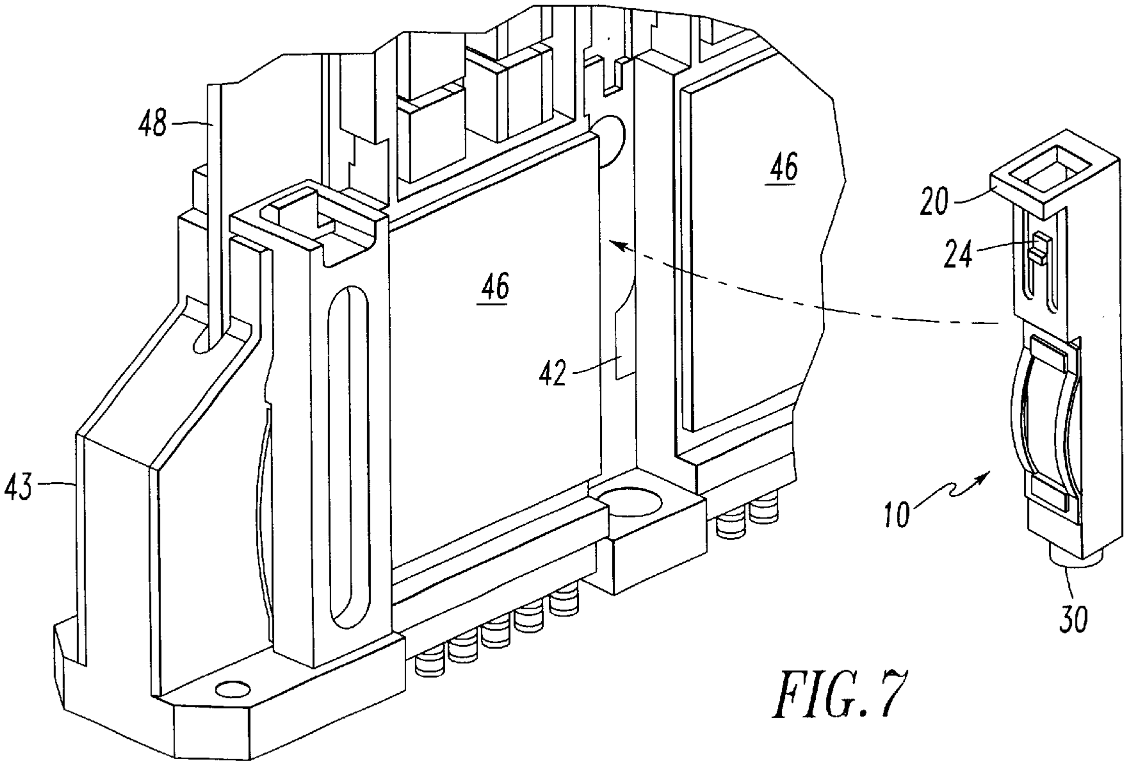
FIG. 7

MINIATURE SELF-LOCKING, SPRING ACTION, MICROWAVE MODULE RETAINER

BACKGROUND OF THE INVENTION

1. Field of the Invention

This invention relates generally to a microwave module retainer. Specifically, the present invention is directed to a self-adjusting, spring action, module retention device for an active electronically scanned array (AESA), also known as an active aperture.

2. Description of Related Art

In a $4^{th}$ generation active electronically scanned array (AESA), multiple microwave transmit/receive (T/R) modules are required. The details of such a T/R module is shown and described in related U.S. Pat. No. 6,114,986 entitled "Dual Channel Microwave Transmit/Receive Module For An Active Aperture of A Radar System" which is incorporated herein by reference.

Accordingly, there is an ongoing need to produce T/R modules that are easy to install into an antenna assembly. Such microwave T/R modules are the electronically active components in the antenna assembly and the T/R modules require cooling. As such, the microwave T/R modules are spaced according to the location of the radiating elements to which they connect and are conduction cooled by coldplates.

Such conduction cooling is typically done by rows of parallel coldplates installed in an array. However, due to such a configuration, there is limited space available for installation of additional components. In addition, the microwave T/R modules require positive contact pressure against the coldplate to help facilitate the heat removal from the microwave module. In addition, motion of the T/R modules during operation can cause the RF connectors to disengage. To prevent/limit the motion of the T/R modules, a module retention device is required.

Previous designs of module retention devices included wedgelocks to force the microwave modules into contact with the coldplate by wedging between the lid/ring frame of the microwave module and the adjacent coldplate. Such a wedgelock was developed by the assignee of this invention and is shown and described in U.S. Pat. No. 6,005,531, entitled, "Antenna Assembly Including Dual channel Microwave Transmit/receive Modules," issued on Dec. 21, 1999, and is intended to be incorporated herein by reference.

The wedgelocks disclosed therein grip the sides of each T/R module causing the heat sink plate on the bottom of the module to be pressed tightly against the respective coldplates upon the actuation of screw members which forms part of the wedgelock assemblies. In addition, the load produced by the wedgelocks were not self contained and consequently the loads traveled throughout the antenna assembly, causing the antenna to distort.

In addition, the conventional wedgelock system relied upon friction to generate its module retention load and to retain the module in place. Furthermore, during the assembly process, the wedgelocked antenna was generally subjected to elevated temperatures, and then returned to room temperature. After returning to room temperature, the expansion and contraction of the wedgelock resulted in loose wedgelocks throughout the antenna assembly. The loose wedgelocks required manual tightening since their loads were not self-adjusting.

In addition, with the conventional wedgelocks, when a microwave T/R module is replaced, the wedgelocks must be loosened and removed. When one wedgelock is removed, the entire assembly is affected because of the interdependency between wedgelocks, all of which contribute to the cumulative load that they impart to the assembly.

Hence, there is a need to provide a T/R module retention device that avoids the problems introduced by the conventional wedgelocks.

SUMMARY OF THE INVENTION

Accordingly, one aspect of the present invention is to provide an improved retainer device for microwave T/R modules.

It is a further aspect of the present invention to provide an improved retainer device for an active electronically scanned antenna array utilized in connection with phased array radars.

And it is yet another aspect of the invention to provide a module retention device that relies upon a self-adjusting spring configuration to provide a sufficient load.

These and other aspects are achieved by a miniature, self-locking, spring action, microwave T/R module retainer device which includes a retainer body that holds a spring and transfers the spring load to a single coldplate. The spring has a double arch configuration designed to contact an extended heat sink plate located on one side of the microwave T/R module. When in position, the deflection of the double arch spring of the retainer device imparts a force onto the extended heat sink, pressing the T/R module against the coldplate when the module retainer device is installed. Once installed, the retainer device exhibits a self-locking characteristic.

Further, if the location of the T/R module changes due to thermal or mechanical loads, the potential energy stored in the arch spring allows the spring to automatically re-adjust accordingly.

These and other aspects of the invention are realized in one embodiment by an exemplary module retainer body including: an aft latch (or hook); a cantilever arm with latch having a removal tab; a spring retention tab; a spring alignment pad; a forward (bottom) post; and a module excursion stop.

These and other aspects of the invention are further realized in another embodiment by a preferred module retainer body including: a aft latch; a spring retention tab, a spring alignment pad; and a forward (bottom) post.

The module retainer/retention device in each of the embodiments makes contact with the microwave T/R modules at the extended heat sink once the microwave T/R modules have been installed. This is accomplished by inserting/latching the retainer device to the mating features on the coldplate.

Further scope of applicability of the present invention will become apparent from the detailed description provided hereinafter. It should be noted, however, that the detailed description and specific examples, while disclosing exemplary embodiments of the invention, is given by way of illustration only. This is due to the fact that various changes, alterations and modifications coming within the spirit and scope of the invention will become apparent to those skilled in the art.

BRIEF DESCRIPTION OF THE DRAWINGS

Exemplary embodiments of the invention will be described in detail, with reference to the following figures, wherein:

FIG. 6 illustrates an exemplary close up view of the coldplate tab mating features of the T/R assembly in accordance with the present invention;

FIG. 7 illustrates an exemplary contact position of the microwave module retainer in accordance with the present invention.

DETAILED DESCRIPTION OF PREFERRED EMBODIMENTS

Figure 1A:
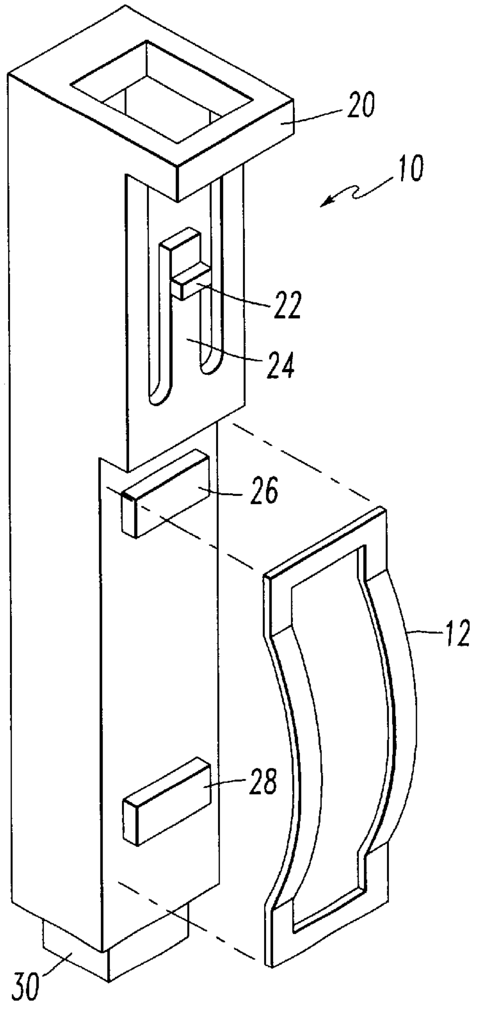
FIGS. 1A–1B illustrate an exemplary embodiment of the microwave module retainer in accordance with the present invention.

For a general understanding of the features of the present invention, references is made to the drawings, wherein like reference numerals have been used throughout to identify identical or similar elements. The following description is intended to cover all alternatives, modification, and equivalents, as may be included within the spirit and scope of the invention.

Figure 1B:
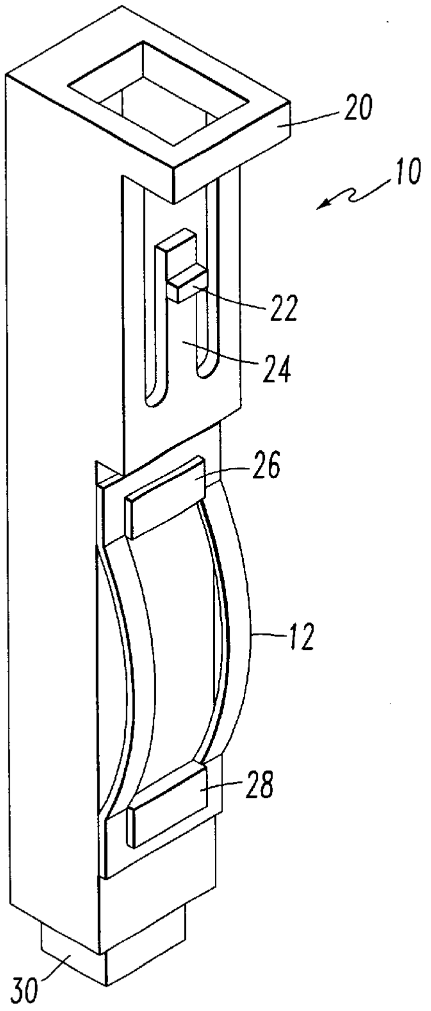

FIGS. 1A–1B illustrates an exemplary embodiment of the module retainer body 10 with and without the arch spring 12 attached thereto. The arch spring 12 consist of two independent yet connected arched springs retained by one body in a double arch spring configuration. The module retainer body 10 is capable of being used with an active electronically scanned array (AESA) assembly to retain a microwave T/R module 46 (see FIGS. 8A–8C) against a coldplate 48 (see FIGS. 4 and 7), by using only the features of the coldplate 48 for support. As such, only a single coldplate 48 is required for module retention.

The module retainer body 10 uses the double arch spring 12 to apply force to the microwave T/R module 46 over a large range of tolerances that are inherent to the production of a ceramic microwave module.

Figure 2A:
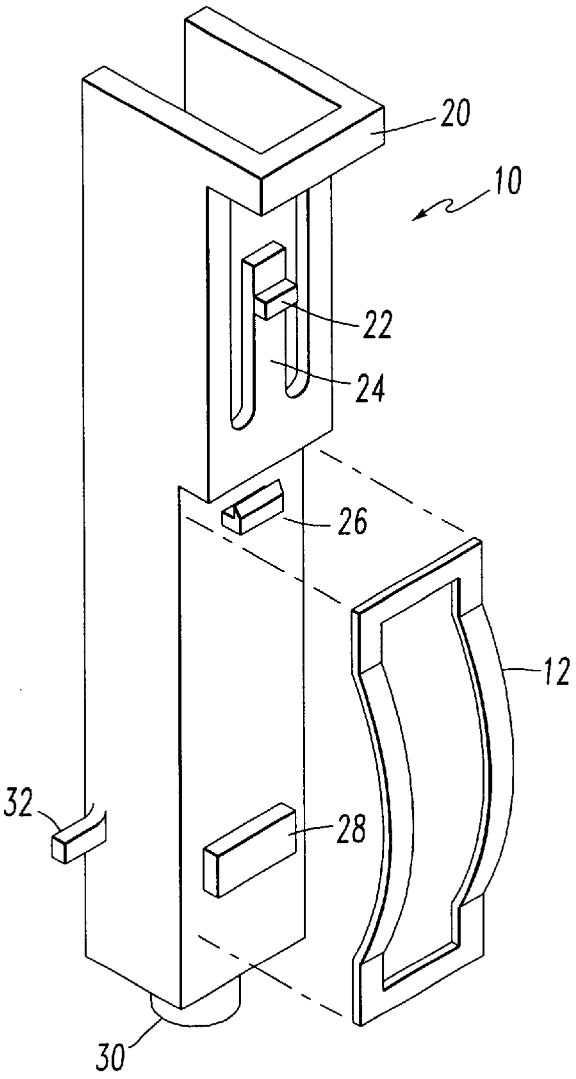
FIGS. 2A–2B illustrate an exemplary embodiment of the components of the microwave module retainer body in accordance with the present invention.
Figure 2B:
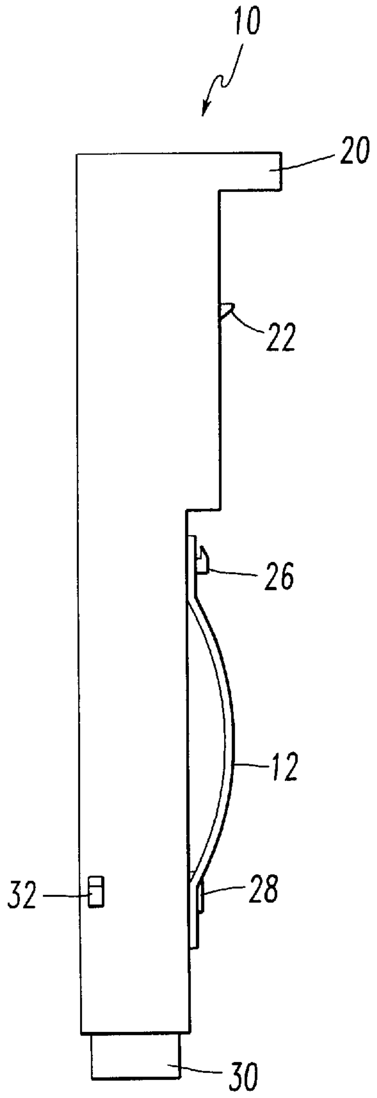

As shown in FIGS. 2A and 2B, the module retainer body 10 includes: an aft latch 20; a removal tab 22; a cantilever arm with latch 24; a spring retention tab 26; a spring alignment pad 28; a forward post 30; and a module excursion stop (1 of 2) 32.

The features of the module retainer body 10 that mate with the coldplate 48 are the aft latch 20, the forward post 30, and the latch of the cantilever arm 24. The aft latch 20 and the forward post 30 transfer the spring force through the body of the module retainer 10 to the coldplate 48. As the aft latch 20 slides over a post on the coldplate tab 50, the forward post is inserted into a pocket 44 in the coldplate mounting foot 43. Concurrently, the latch 24 of the cantilever arm is deflected toward the body of the module retainer 10 as it moves along the surface of the coldplate 48. As the module retainer body 10 is seated into position, the latch 24 of the cantilever arm pops into a hole in the coldplate tab 50, restraining the module retainer body 10 in the forward/aft direction.

The double arch spring 12 contacts the extended heat sinks 42 of the microwave module 46, pushing them against the coldplate 48. The spring retention tab 26 deflects slightly as the double arch spring is assembled to the module retainer body 10 and then returns to its undeflected position, trapping the spring in the assembly. Additionally, the spring alignment pads 28 help to maintain the side to side position of the springs within the assembly.

As shown in FIGS. 1B and 2A, when in position, the double arch spring 12 engages both the spring retention tab 26 and the spring alignment pad 28. Also, as can be seen in the side perspective view of FIG. **2*b*, the arched configuration of the spring 12 protrudes outwardly towards the microwave module 46. The aft latch 20, the removal tab 22, the cantilever arm with latch 24, the forward post 30, and the module excursion stop 32 all are capable of being mated with features on the coldplate 48**.

The module retainer body 10 with attached double arch spring 12 is removed with a custom tool (not shown) that pulls back on the removal tab 22, which consequently releases the latch 24 of the cantilever arm from the hole in the coldplate tab 50. At the same time, the custom removal tool moves the aft latch 20 out of engagement with the other coldplate 48 features. The remaining module retainer body 10 feature, i.e., the module excursion stop 32, fits in a groove of the microwave module 46 and limits forward/aft movement of the module 46 during thermal excursions.

The module retainer body 10 with the attached double arch spring 12 is simple to install and to remove within a confined space and the installation allows visual inspection of proper installation.

Figure 3A:
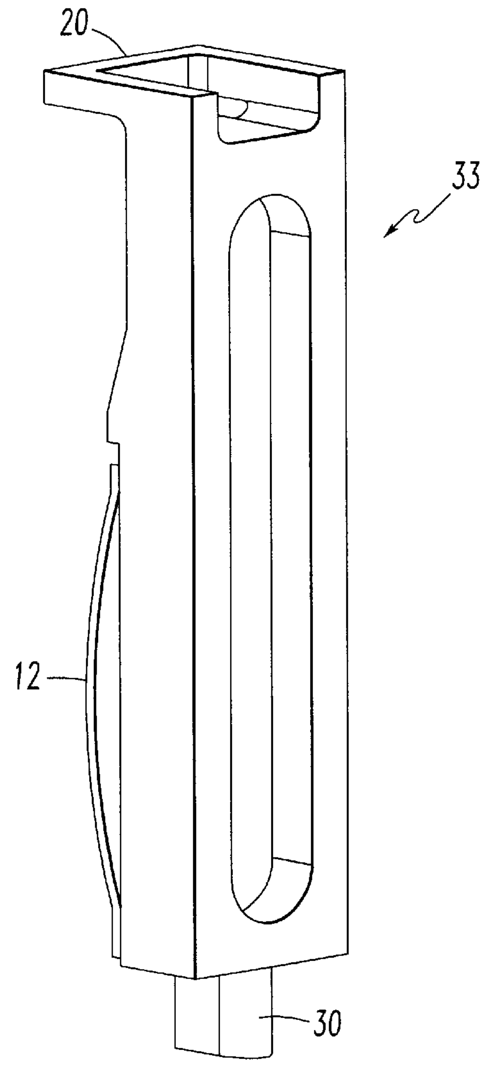
FIGS. 3A–3B illustrate a preferred embodiment of the microwave module retainer in accordance with the present invention.
Figure 3B:
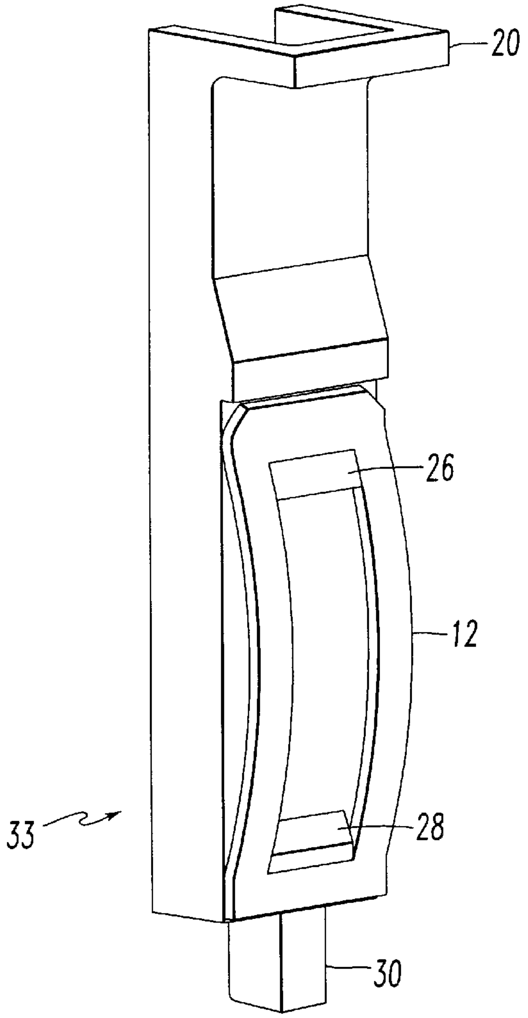

FIGS. 3A and 3B illustrates a preferred embodiment of the module retainer body 33 with the arch spring 12 attached thereto. Like the module retainer body 10 noted above, the module retainer body 33 with arch spring 12 is capable of being used within an active electronically scanned array (AESA) assembly to retain a microwave T/R module 46 (see FIGS. 8A–8C) against a coldplate 48 (see FIGS. 4 and 7), by using only the features of the coldplate 48 for support. As such, only a single coldplate 48 is required for module retention.

As shown in FIGS. 3A and 3B, the module retainer body 33 includes: an aft latch 20; a spring retention tab 26; a spring alignment pad 28; and a forward post 30. As shown in FIG. 3B, when in position, the double arch spring 12 engages both the spring retention tab 26 and the spring alignment pad 28. As can be seen in the front and back perspective views of FIGS. 3A and 3B, module retainer body 33 includes a back recess and a solid forefront. Unlike the module retainer body 10, the preferred embodiment of the module retainer body 33 does not include a removal tab 22 and a cantilever arm with latch 24. The aft latch 20 and the forward post 30 located on the module retainer body 33 are capable of being mated with features on the coldplate 48.

Figure 4:
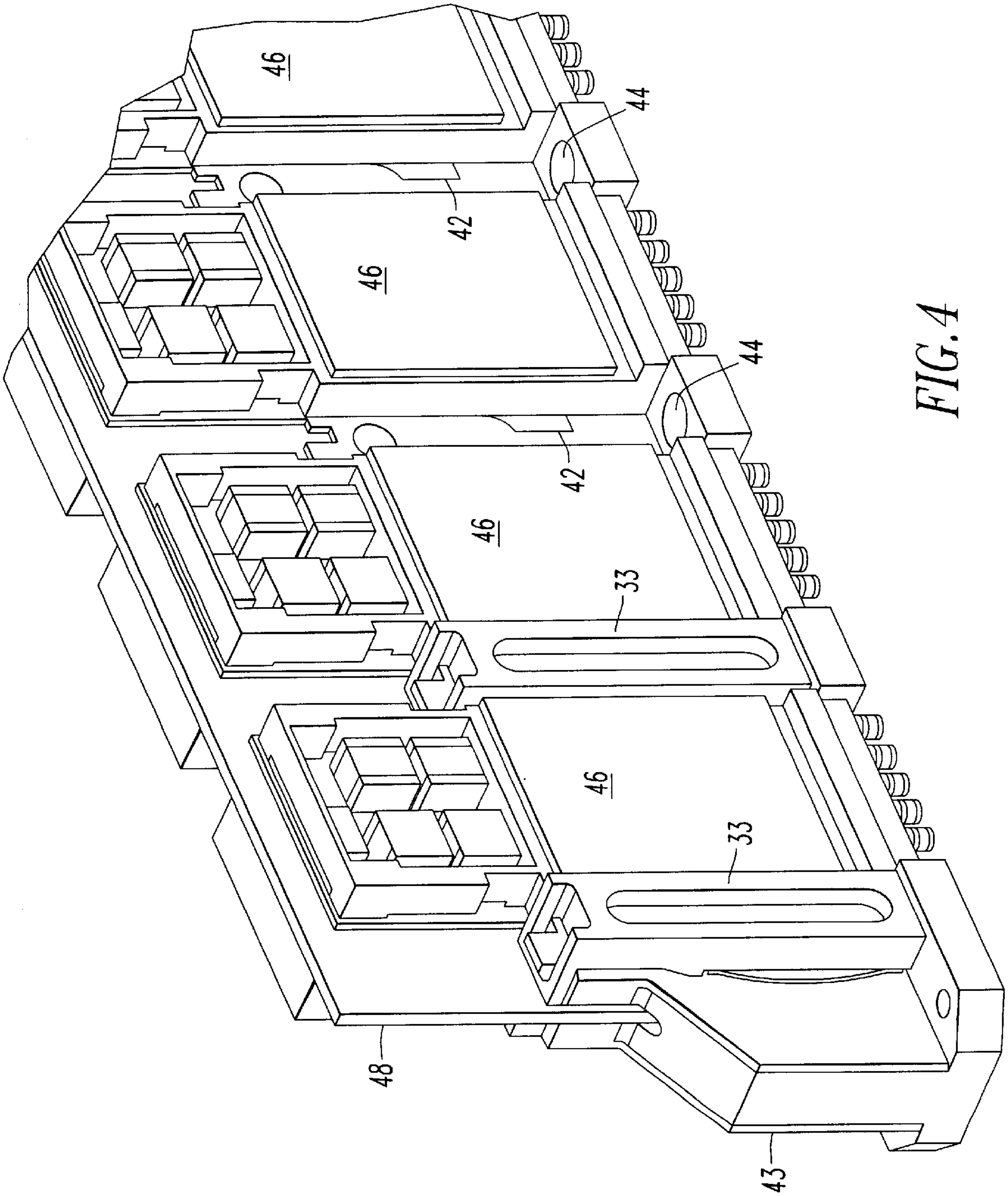
FIG. 4 illustrates an exemplary microwave module retainer device attached to an T/R module assembly in accordance with the present invention.
Figure 5:
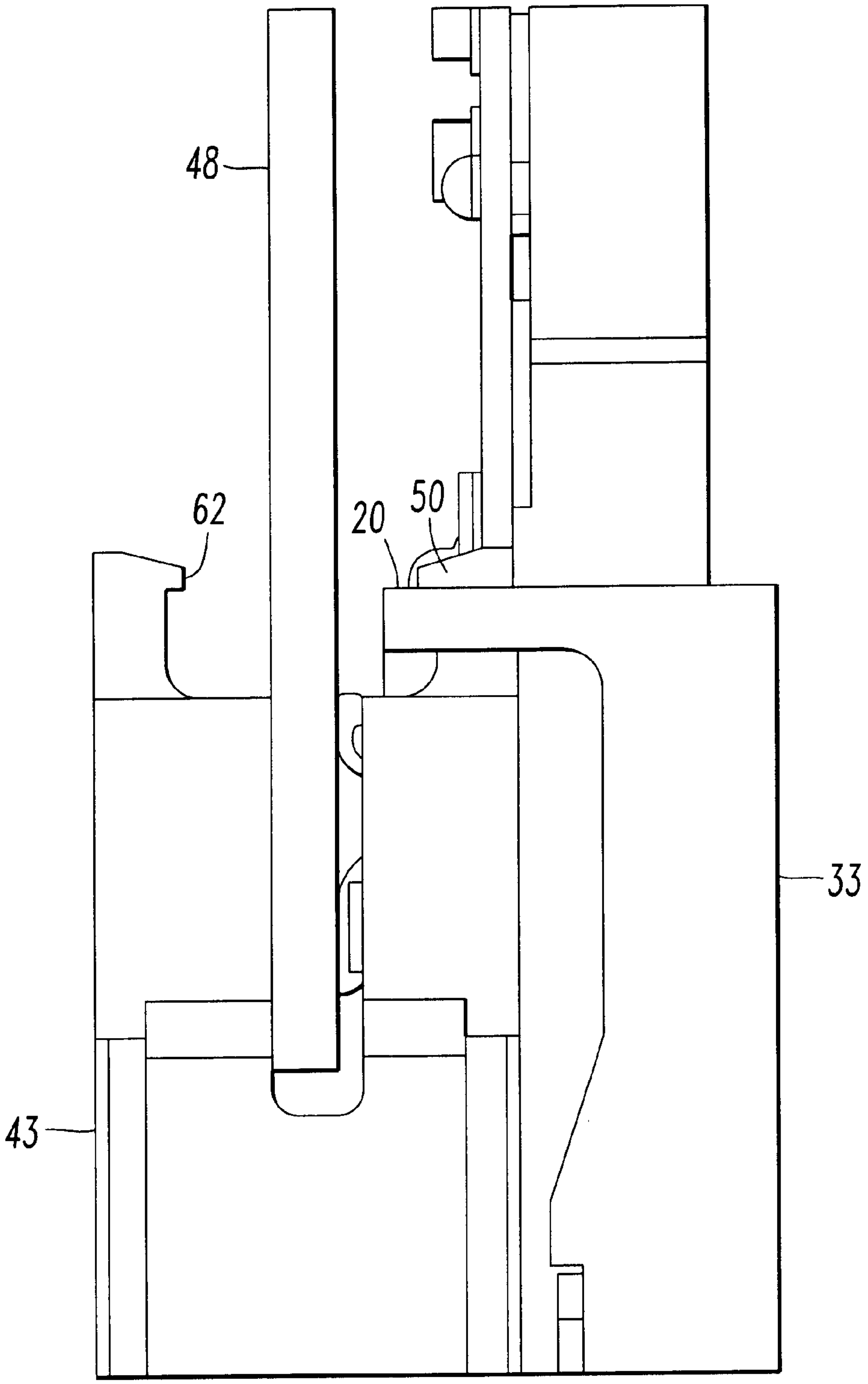
FIG. 5 illustrates an exemplary side view of the microwave module retainer device attached to an T/R module assembly in accordance with the present invention.

FIG. 4 illustrates an exemplary microwave module retainer device 33 attached to a T/R module assembly in accordance with the present invention. Included in the T/R module assembly is a microwave T/R module 46 with extended heat sinks 42 (see also FIGS. 8A–8C), a coldplate 48, and a coldplate pocket 44 (also known as a counterbore). To install the module retainer device 33 the forward post on the end of the retainer 33 is inserted into the coldplate pocket 44 located in the coldplate mounting foot 43. The double arch spring 12 is over-compressed to allow the aft latch 20 (or hook) on the module retainer body 33 to clear the undercut tab 62 (see FIG. 6) in the coldplate tab 50 (see FIG. 5) as the retainer 33 is pushed down. The z-axis catch for the retainer 33 is the undercut 62 in the coldplate.

Deflection of the spring 12 imparts a force onto the extended heat sinks 42 located on the backside of the microwave T/R module 46, pressing the microwave T/R module 46 against the coldplate when the module retainer 33,10 is installed as shown in FIG. 4. Two module retainers 33,10 are necessary to contact the extended heat sink 42 on either side of the microwave T/R module 46 and to provide positive retention of the module 46 against the coldplate.

The two independent yet connected arch springs 12 allows the spring to adjust for height variation between neighboring springs. If the location of the microwave T/R module 46 would change due to thermal or mechanical loads, the potential energy stored in the arch spring 12 will allow the spring 12 to readjust accordingly. It is not necessary to re-adjust the spring 12 by hand because the load to the assembly is not cumulative across the antenna which could cause parts to distort. In addition, the removal of one module retainer 33,10 does not affect the other module retention devices 33,10 used.

The installed force of the double arch spring 12 pulls against the undercut tab 62, holding the retainer 33 under the undercut tab 62. To remove the retainer 33 the double arch spring 12 is over-compressed until the aft latch 20 (or hook) on the retainer 33 clears the undercut tab 62 as the retainer 33 is pulled up.

The retainer device 33,10 is capable of applying force to the microwave module 46 over a large range of tolerances that are inherent to the production of the ceramic microwave module 46. The preferred embodiment of the retainer 33 as shown in FIGS. 3A and 3B is simple to install and remove within a confined space and also allows visual inspection of proper installation.

FIG. 7 illustrates an exemplary contact position of the microwave T/R module retainer 10 with the extended heat sink 42 on either side of the microwave T/R module 46 in accordance with the present invention. The microwave module retainer 33 also contacts the extended heat sink 42 in a similar fashion. As shown in FIG. 7, the one retainer 33,10 can be shared between two microwave T/R modules 46 (i.e., the retainer 33,10 is situated between to adjacent T/R modules), thus reducing the number of retainers 33,10 necessary.

Figure 8C:
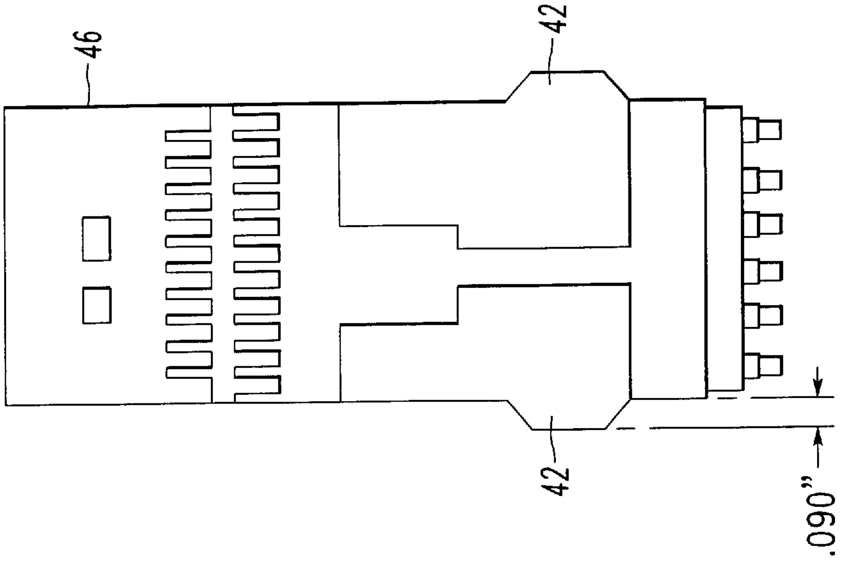
FIGS. 8A–8C illustrate an exemplary microwave module assembly with extended heat sinks used in accordance with the present invention.
Figure 8B:
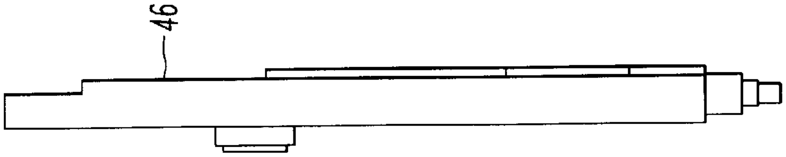
Figure 8A:
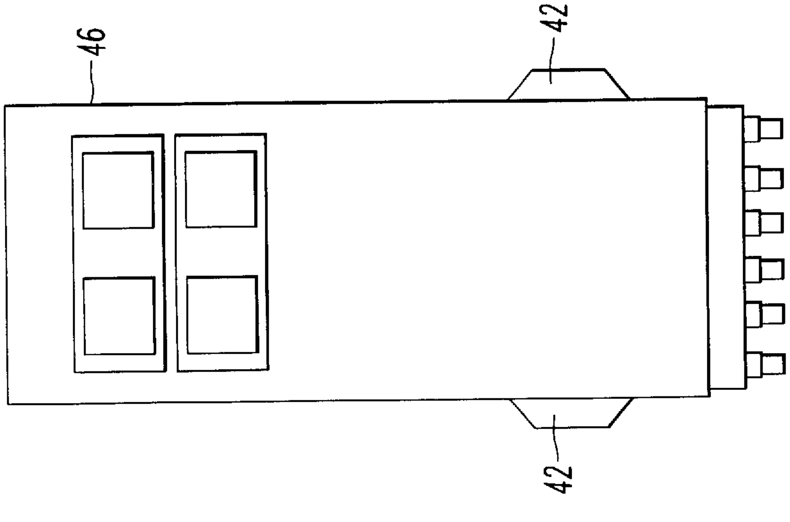

FIGS. 8A–8C illustrate an exemplary microwave T/R module 46 having extended heat sinks 42 flaring beyond the edges on either side of the module. The extensions of the heat sinks 42 from the edges of the module 46 can measure about 0.09 inches. Each T/R module 46 comprises a module (not shown) wherein two discrete T/R signal channels are implemented side-by-side in a common package.

In particular, in the T/R module 46 two discrete transmit/receive channels are implemented in a single package and the T/R module has the capability of providing combined functions, control and power conditioning while utilizing a single multi-cavity, multi-layer substrate comprised of high temperature cofired ceramic (HTCC) layers.

Although preferred embodiments of the present invention have been described in detail herein, it should be understood that many variations and/or modifications of the inventive concepts herein taught still fall within the spirit and scope of the present invention. For example, variations to the spring attachment and configuration may include: two separate springs in one body; one spring per body; an integral arch spring and forward/aft latch; in integral arch spring staking tab attaching the spring to the retainer body; using adhesive to attach the spring to the body; no spring or springs, whereby the retainer body acts as the spring; and a cut out on the spring that attaches the spring to a feature on the body through a snap fit or deformation of the body's mating feature. In addition, variations to the module retainer device attachment to the coldplate may include: a pogo pin loaded by a compression spring that snap into a slot in the coldplate; the retainer body being screwed into the coldplate tab; and a cantilever arm attached to the coldplate could snap into a pocket in the retainer.

What is claimed is:

1. A retainer device in an antenna assembly for holding a microwave T/R module in place against a single coldplate, comprising:

a retainer body; and a spring, the retainer body holding the spring;

the microwave T/R module having an extended heat sink plate on one side thereof, wherein the retainer body with the spring attached thereto contacts the extended heat sink on the T/R module and a spring force presses the T/R module against the coldplate.

2. The retainer device according to claim 1, wherein the spring consists of two independent yet connected arch springs.

3. The retainer device according to claim 2, wherein the spring is self-adjusting over a range of tolerances.

4. The retainer device according to claim 2, wherein the two arch spring configuration allows the spring to adjust for height variations between any neighboring springs.

5. The retainer device according to claim 1, wherein the retainer body includes a spring retention tab and a spring alignment pad, wherein the spring engages both the spring retention tab and the spring alignment pad.

6. The retainer device according to claim 1, wherein the retainer body includes an aft latch and a forward post, wherein when the retainer device is installed the aft latch and the forward post are mated with features on the coldplate in a self-locking fashion.

7. The retainer device according to claim 1, wherein one retainer can be shared between two microwave T/R modules in the antenna assembly.

8. The retainer device according to claim 1, wherein a module retention load is supported by the single coldplate and the load is not cumulative across the antenna assembly.

9. The retainer device according to claim 1, wherein the extended heat sink extends beyond the edges on either side of the T/R module.

10. The retainer device according to claim 9, wherein the extended heat sink extends about 0.09 inches from the edges of the T/R module.

11. Retainer devices in an active aperture for holding microwave T/R modules in place against a single coldplate, comprising:

a plurality of retainer bodies; and a spring associated with each retainer body, the retainer bodies holding the springs;

each of the microwave T/R modules having an extended heat sink plate on one side thereof, wherein the retainer bodies with the springs attached thereto contacts the extended heat sinks and a spring force associated with each spring presses the T/R modules against the single coldplate, wherein the removal of one retainer device does not affect the retention abilities of other retainer devices in the active aperture.

12. A module retainer assembly, comprising:

two independent yet connected arch springs;

a retainer body, the retainer body having a hook, a spring retention tab, a spring alignment pad, and a bottom post;

wherein the arch springs are attached to the retainer body by mating with the spring retention tab and the spring alignment pad, wherein the arch springs, the hook and the post all together act as a self-locking mechanism.

13. A module retainer assembly, comprising:

two independent yet connected arch springs;

a retainer body, the retainer body having a hook, a cantilever arm with latch having a removal tab, a spring retention tab, a spring alignment pad, and a bottom post;

wherein the arch springs are attached to the retainer body by mating with the spring retention tab and the spring alignment pad, wherein the arch springs, the hook, the cantilever arm with latch, and the post all together act as a self-locking mechanism.

* * * * *